(12) United States Patent
Cho

(10) Patent No.: US 8,780,644 B2
(45) Date of Patent: Jul. 15, 2014

(54) PROGRAMMING METHOD FOR NONVOLATILE MEMORY APPARATUS

(75) Inventor: Myung Cho, Incheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 385 days.

(21) Appl. No.: 12/983,105

(22) Filed: Dec. 31, 2010

(65) Prior Publication Data

US 2012/0106262 A1    May 3, 2012

(30) Foreign Application Priority Data

Oct. 29, 2010    (KR) .................. 10-2010-0106597

(51) Int. Cl.
*G11C 7/10*    (2006.01)

(52) U.S. Cl.
USPC .................................................. 365/189.05

(58) Field of Classification Search
USPC ............. 365/185.25, 185.18, 189.05, 185.03, 365/233, 236, 230.05, 230.08, 203, 290, 365/210
See application file for complete search history.

(56) References Cited

U.S. PATENT DOCUMENTS

| | | | | |
|---|---|---|---|---|
| 5,625,590 A * | 4/1997 | Choi et al. | ............... | 365/185.17 |
| 5,973,961 A | 10/1999 | Park et al. | | |
| 6,154,403 A * | 11/2000 | Tanzawa et al. | ............... | 365/203 |
| 6,937,510 B2 * | 8/2005 | Hosono et al. | ........... | 365/185.03 |
| 7,187,584 B2 * | 3/2007 | Chang | ....................... | 365/185.17 |
| 7,471,576 B2 * | 12/2008 | Khouri et al. | ............. | 365/189.05 |
| 2003/0117856 A1 * | 6/2003 | Lee et al. | .................. | 365/189.05 |
| 2003/0210576 A1 | 11/2003 | Hwang et al. | | |
| 2004/0141402 A1 * | 7/2004 | Kim | ......................... | 365/230.08 |
| 2005/0162918 A1 * | 7/2005 | Kim et al. | ................ | 365/185.22 |
| 2006/0120152 A1 | 6/2006 | Lee et al. | | |
| 2009/0097314 A1 | 4/2009 | Lee et al. | | |
| 2009/0273973 A1 * | 11/2009 | Pyeon | ...................... | 365/185.03 |

FOREIGN PATENT DOCUMENTS

| | | |
|---|---|---|
| JP | 2002-025277 | 1/2002 |
| JP | 2007-026652 | 2/2007 |
| KR | 1020100065508 A | 6/2010 |
| KR | 1020100133618 A | 12/2010 |

* cited by examiner

*Primary Examiner* — Douglas King
(74) *Attorney, Agent, or Firm* — William Park & Associates Patent Ltd.

(57) ABSTRACT

Provided is a method for programming a nonvolatile memory apparatus which includes a bit line selector coupled to first and second bit lines and a page buffer including a main data transmission switch coupled to the bit line selector, a first latch coupled to the main data transmission switch, a temporary data transmission switch coupled to the bit line selector, and a second latch coupled between the temporary data transmission switch and the first latch. In the programming when the first bit line is precharged to a power supply voltage level, a main data transmission switch and a temporary data transmission switch are simultaneously turned on to set up a voltage of the second bit line depending on data levels stored in the first and second latches.

20 Claims, 3 Drawing Sheets

PROGRAMMING METHOD FOR NONVOLATILE MEMORY APPARATUS

CROSS-REFERENCES TO RELATED APPLICATION

The present application claims priority under 35 U.S.C. §119(a) to Korean application number 10-2010-0106597, filed on Oct. 29, 2010, in the Korean Intellectual Property Office, which is incorporated herein by reference in its entirety.

BACKGROUND

1. Technical Field

The present invention relates to a semiconductor memory apparatus, and more particularly, to a programming method for a nonvolatile memory apparatus.

2. Related Art

In a nonvolatile memory apparatus represented by a flash memory apparatus, a data level stored in each memory cell is defined by a threshold voltage of the memory cell, and a program operation is performed by a method of changing the threshold voltage of the memory cell.

In general, a program operation of a nonvolatile memory apparatus is performed by an incremental step pulse program (ISSP) scheme, and will be described below with reference to FIG. 1.

An active high signal is said to be asserted when it is in the high level, and an active low signal is said to be asserted when it is in the low level. Additionally, when referring to signals, the terms "asserted," and "enabled" may be used interchangeably depending upon context. Similarly, the terms "deasserted" and "disabled" may be used interchangeably depending upon context.

FIG. 1 is a diagram explaining a program method using the ISSP scheme.

First, a first-step program pulse VPGM1 is applied to program selected memory cells. Then, a verification voltage PVER is applied to the selected memory cells so as to pass memory cells with threshold voltages Vth1 higher than the verification voltage PVER.

After that, a second-step program pulse VPGM2, which has an increase of a constant voltage over the first step-program pulse Vth1, is applied to program the memory cells with threshold voltages Vth2 equal to or lower than the verification voltage PVER. At this time, the passed memory cells with the threshold voltages Vth1 are not programmed, thereby preventing the memory cells from being over-programmed.

Similarly, even after the second-step program pulse VPGM2 is applied to perform the program, the threshold voltages Vth3 and Vth4 of the memory cells are compared with the verification voltage VPER, and the program and the verification are performed while gradually increasing the program pulse (VPGM3, VPGM4, . . . ) until all the memory cells are programmed.

That is, referring to FIG. 2, the program pulse voltage is increased in steps as the threshold value Vth of certain memory cells selected for programming become increasingly higher than the verification voltage PVER.

Recently, a double verification method has been used during a program operation, in order to make more uniform the threshold voltage distribution of programmed cells.

In the double verification method, the level of a program pulse differs depending on the threshold voltage levels of selected cells. In a verification process, cells having a threshold voltage Vth higher than a verification voltage are classified into program-prohibited cells, cells having a threshold voltages Vth lower than the verification voltage but higher than a preset reference voltage are classified into low-speed program cells, and cells having a threshold voltages Vth lower than the preset reference voltage are classified into general program cells.

After the cells are classified in such a manner, a subsequent program pulse is not applied to the program-prohibited cells. Meanwhile, a low-speed program pulse is applied to the low-speed program cells, and a normal program pulse is applied to the general program cells, as in a general ISSP scheme.

For this process, an operation of setting up a bit line depending on the threshold voltages of cells to be programmed should be done before the program pulses are applied.

FIG. 3 is a diagram explaining a conventional bit line setup method in a nonvolatile memory apparatus, and shows a case in which an even bit line BLe is programmed.

When the even bit line BLe is to be programmed, an odd bit line BLo should be in a program-prohibited state. For this condition, an even discharge signal DISCHE and an odd discharge signal DISCHO are enabled, and a power supply voltage VCC is applied to a verification voltage application terminal VIRPWR to precharge the even bit line BLe and the odd bit line BLo (①).

Subsequently, in order to discharge a bit line coupled to a memory cell to be programmed, that is, the even bit line BLe, the even discharge signal DISCHE is disabled, and an even bit line selection signal SELBLE is enabled. Furthermore, the odd discharge signal DISCHO maintains the enable state, and an odd bit line selection signal SELBLO is disabled.

At this time, a first latch SL1 of a page buffer coupled to a memory cell which has been programmed stores high-level data such that the memory cell is not over-programmed. As a sensing control signal PBSENSE and a main data transmission signal MTRAN are enabled, a discharge operation does not occur in a bit line coupled to the memory cell which has been completely programmed. On the other hand, since the first latch SL1 of a page buffer coupled to the memory cell classified as a general program cell stores low-level data, a discharge operation occurs (②).

Then, in order that a bit line coupled to a low-speed program cell has a preset level Va (<VCC), a temporary data transmission signal TTRAN is enabled. At this time, the sum Vth+Va of a threshold voltage of a transistor N4 to which the temporary data transmission signal TTRAN is applied and the preset level of voltage is applied (③).

Through the above-described process, the bit line voltage of the program-prohibited cell becomes a power supply voltage (VCC) level, the bit line voltage of the low-speed program cell becomes the preset voltage (Va) level, and the voltage of the general program cell becomes a logic low level.

FIG. 4 is a graph explaining changes in the bit line voltage during the bit line setup.

While the even bit line BLe and the odd bit line BLo are precharged (①), the voltage V_BL of the even bit line BLe gradually increases to the power supply voltage level.

While the even bit line BLe is discharged (②), the bit line voltage V_BL of the program-prohibited cell which has been already programmed maintains the power supply voltage level, and the bit line voltage V_BL of the general program cell is discharged to a low level.

Furthermore, while the bit line coupled to the low-speed program cell is set up (③), the bit line voltage V_BL of the program-prohibited cell maintains the power supply voltage level, the bit line voltage V_BL of the general program cell maintains a low level, and the bit line voltage V_BL of the low-speed program cell changes to the preset level Va.

In FIG. 4, '11' represents a data value stored in the first and second latches SL1 and SL2 when the bit line of the program-prohibited cell is set up, '00' represents a data value stored in the first and second latches SL1 and SL2 when the bit line of the general program cell is set up, and '01' represents a data value stored in the first and second latches SL1 and SL2 when the bit line of the low-speed program cell is set up.

As such, since the process of setting up the bit line for the program operation in the nonvolatile memory apparatus is performed in three stages, a considerable amount of time is required for the setup process.

Furthermore, after a bit line of a memory cell to be programmed should be precharged, the bit line should be discharged, and the discharged bit line should be again precharged to the preset level Va. Therefore, the current consumption increases. Furthermore, when the precharged bit line is again discharged, a coupling capacitance with an adjacent bit line may occur. In this case, the voltage of the bit line which should maintain the precharge state may be reduced, and thus current consumption may occur to compensate this reduction. Furthermore, when a voltage is supplied to maintain the precharge voltage, a peak current may flow. In this case, a sudden voltage drop may occur, and thus a system clock down may occur.

SUMMARY

In one embodiment of the present invention, there is provided a method of programming a nonvolatile memory apparatus. The nonvolatile memory apparatus includes a bit line selector coupled to first and second bit lines and a page buffer including a main data transmission switch is coupled to the bit line selector. A first latch is coupled to the main data transmission switch, a temporary data transmission switch coupled to the bit line selector, and a second latch is coupled between the temporary data transmission switch and the first latch. When the first bit line is precharged to a power supply voltage level, the main data transmission switch and the temporary data transmission switch are simultaneously turned on to set up a voltage of the second bit line depending on data levels stored in the first and second latches.

In another embodiment of the present invention, there is provided a program method of a nonvolatile memory apparatus which applies an incremental step pulse to selected memory cells and repeats a program process and a verification process. The memory cells are classified into program-prohibited cells, low-speed program cells, and general program cells through the verification process. Voltages are set up at the same time for a bit line coupled to the program-prohibited cells, a bit line coupled to the low-speed program cells, and a bit line coupled to the general program cells.

BRIEF DESCRIPTION OF THE DRAWINGS

Features, aspects, and embodiments are described in conjunction with the attached drawings, in which.

DETAILED DESCRIPTION

Hereinafter, a program method of a nonvolatile memory apparatus according to the present invention will be described below with reference to the accompanying drawings through exemplary embodiments.

Figure 5:
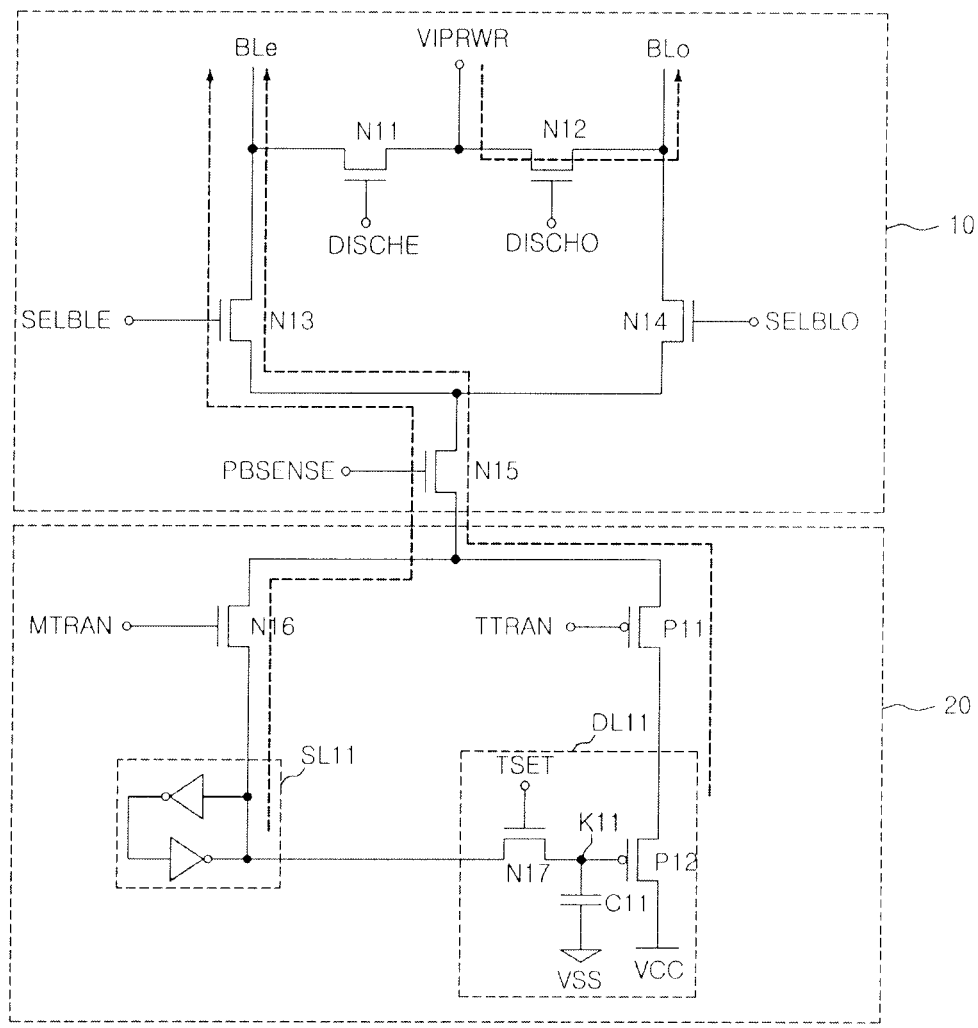
FIG. 5 is a diagram explaining a program method of a nonvolatile memory apparatus according to one embodiment.

FIG. 5 is a diagram explaining a program method of a nonvolatile memory apparatus according to one embodiment.

A general nonvolatile memory apparatus includes a bit line selector 10 coupled to a bit line of a memory cell block and a page buffer 20.

Although not illustrated, the memory cell block includes a plurality of drain selection switches driven by a drain selection signal, a memory cell array, and a plurality of source selection switches driven by a source selection signal. A drain selection switch, a plurality of memory cells coupled in series to the drain selection switch, and a source selection switch coupled to a source terminal of a final memory cell among the plurality of memory cells coupled in series form one cell string, and a plurality of memory cells coupled to one word line form one page. A pair of bit lines BLe and BLo are extended from drain terminals of the respective drain selection switches and coupled to the bit line selector 10.

In general, the even bit line BLe and the odd bit line BLo share one page buffer, and thus a program operation is individually performed for an even page and an odd page.

When the even page is programmed, the odd bit line BLo needs to be precharged to a power supply voltage (VCC) level. Therefore, an odd discharge signal DISCHO is enabled, and a power supply voltage VCC is applied to a verification voltage application terminal VIRPWR to precharge the odd bit line BLo.

Simultaneously, an even bit line selection signal SELBLE, a sensing control signal PBSENSE, a main data transmission signal MTRAN, and a temporary data transmission signal TTRAN are enabled to change the level of the even bit line BLe depending on data levels stored in first and second latches SL11 and DL11, respectively.

In this embodiment, the first latch SL11 may include a static latch, and the second latch DL11 may include a dynamic latch.

The static latch may maintain only data in logic low (0) and logic high (1) states, but the dynamic latch may have a floating state in addition to the logic low (0) and logic high states.

Figure 1:
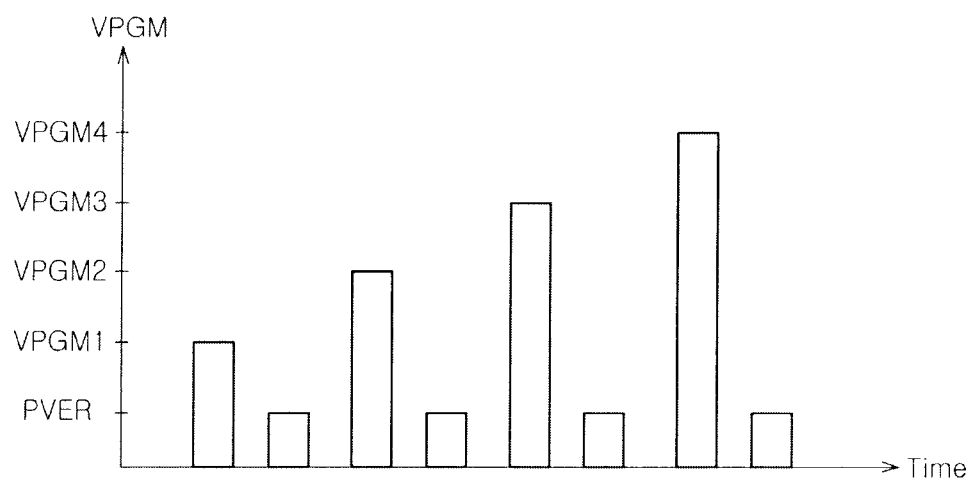
FIG. 1 is a diagram explaining a program method using the ISSP scheme.
Figure 2:
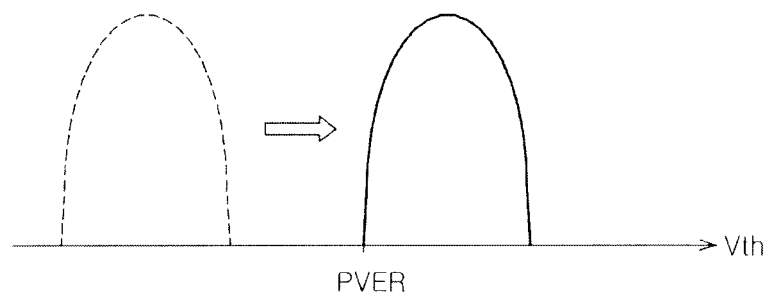
FIG. 2 is a diagram explaining threshold voltage changes of cells through the program.
Figure 3:
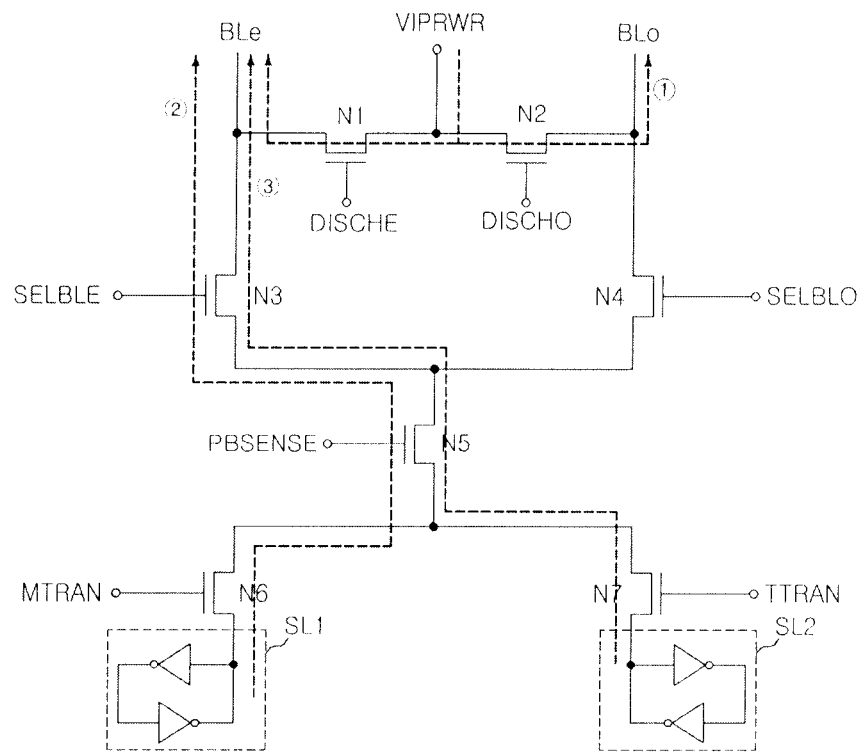
FIG. 3 is a diagram explaining a conventional bit line setup method in a nonvolatile memory apparatus.
Figure 4:
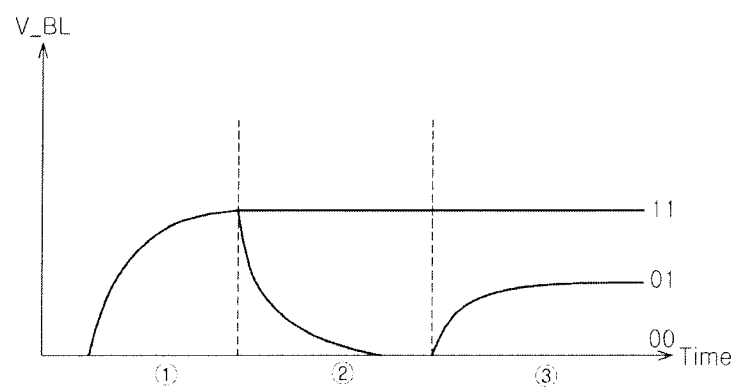
FIG. 4 is a graph explaining changes in a bit line voltage during a bit line setup

That is, the page buffer 20 of the nonvolatile memory apparatus illustrated in FIG. 3 include the pair of latches SL1 and SL2 implemented as static latches. Therefore, since two latches SL1 and SL2 cannot be operated at the same time, an operation of setting up a voltage of a bit line coupled to a cell to be programmed is performed in two stages.

On the other hand, since the dynamic latch can have a floating state, it may be driven at the same time as the static latch is driven.

Referring to FIG. 5, the second latch DL11 implemented as a dynamic latch SL11 includes a switching element N17, a capacitor C11, and a switching element P12. The switching element N17 has a source terminal coupled to the first latch SL11, and is configured to be driven by a temporary data setting signal TSET. The capacitor C11 is coupled between a drain terminal of the switching element N17 and a ground terminal VSS. The switching element P12 is configured to be driven by a voltage applied to the drain terminal of the switching element N17, and coupled between a drain terminal of a temporary data transmission switch P11 and a power supply voltage supply terminal VCC.

When the switching element N17 is turned off, this state may be defined as the floating state of the second latch DL11. Therefore, the floating state of the dynamic latch may be used to enable the main data transmission signal MTRAN and the temporary data transmission signal TTRAN at the same time, thereby reducing a time required for the bit line setup.

More specifically, during a bit line setup for a program operation, the main data transmission signal MTRAN is enabled to a voltage obtained by summing the threshold voltage of a main data transmission transistor N16 and a preset level of voltage, and the temporary data transmission signal TTRAN is enabled to a low level.

In such a state, when high-level data is stored in the first latch SL11 and high-level data is stored in the second latch DL11 in the floating state, a switching element P12 is turned off, and thus the preset level of voltage Va (<VCC) is applied to the even bit line BLe. That is, the voltage of the even bit line BLe coupled to a low-speed program cell is set up.

Meanwhile, when low-level data is stored in the first latch SL11 and high-level data is stored in the second latch DL11 in the floating state, the switching element P12 is turned off, and thus the voltage of the even bit line BLe becomes a low level. That is, the voltage of the even bit line BLe coupled to a general program cell is set up to a low level.

Similarly, when high-level data is stored in the first latch SL11 and low-level data is stored in the second latch DL11, the switching element P12 is turned on, and thus the voltage of the even bit line BLe is precharged to the power supply voltage level. That is, the voltage of the even bit line BLe coupled to a program-prohibited cell is set up to the power supply voltage level.

In this embodiment, as soon as the odd bit line BLo is precharged, the main data transmission signal MTRAN is enabled to the voltage obtained by summing the threshold voltage of the main data transmission switch N16 and the preset level of voltage, and the temporary data transmission signal TTRAN is simultaneously enabled. Then, the voltage of the even bit line BLe is set up to the power supply voltage level, the preset voltage level, or a low level, depending on the data levels stored in the first and second latches SL11 and DL11.

A program pulse is applied to program selected cells, and the memory cells may be classified into program-prohibited cells, low-speed program cells, and general program cells through the verification process. As in this embodiment, the static latch and the dynamic latch may be used to set up a plurality of bit lines to a power supply voltage level, a preset voltage level, or a low level at the same time.

When the voltage of the bit line is set up in three stages as in the conventional program method, a time obtained by multiplying the time required for three-stage bit line setup by the total application number of program pulses may be required. In this embodiment, however, since the voltage of the bit line may be set up through a single process, the bit line setup time may be significantly reduced, which makes it possible to improve the program performance.

Furthermore, after all the bit lines are precharged, a bit line of a page to be programmed does not need to be discharged. Therefore, it is possible to reduce the current consumption. Furthermore, when the bit line of the page to be programmed is discharged, it is possible to suppress a phenomenon in which the voltage of the bit line which is to maintain the precharge voltage decreases. When the voltage of the bit line which is to maintain the precharge voltage decreases, a higher precharge voltage should be supplied to compensate for the decrease. At this time, a peak current may occur to destabilize a system operation. For example, a clock down may occur.

In this embodiment, however, the process of precharging a bit line of a page to be programmed and then discharging the bit line is not necessary. Therefore, it is possible to prevent the occurrence of peak current and the system instability.

Figure 6:
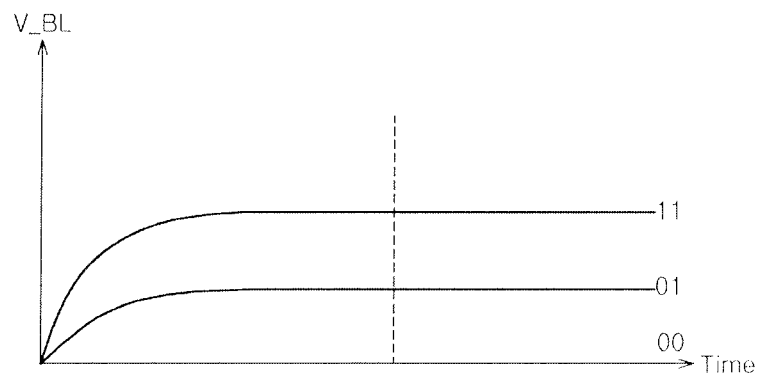
FIG. 6 is a graph explaining voltage changes of a bit line during a program operation according to the embodiment.

FIG. 6 is a graph explaining voltage changes of a bit line during a program operation according to the embodiment.

When high-level data are stored in both the first latch SL11 and the second latch DL11, a voltage obtained by summing the threshold voltage of the main data transmission transistor N16 and the preset level of voltage Va is applied as the level of the main data transmission signal MTRAN. The voltage V_BL of the bit line corresponds to the preset voltage Va.

When low-level data is stored in the first latch SL11 and high-level data is stored in the second latch DL11, the voltage V_BL of the bit line becomes a low level.

Furthermore, when high-level data is stored in the first latch SL11 and low-level data is stored in the second latch DL11, the power supply voltage VCC is supplied through the switching element P12, and the voltage V_BL of the bit line is set up to the power supply voltage level.

According to the present invention, the voltage of a bit line of a page selected for program and the voltage of an unselected bit line may be set through a single process. Therefore, operational efficiency and stability of the nonvolatile memory apparatus are improved.

While certain embodiments have been described above, it will be understood to those skilled in the art that the embodiments described are by way of example only. Accordingly, the program method described herein should not be limited based on the described embodiments. Rather, the program method described herein should only be limited in light of the claims that follow when taken in conjunction with the above description and accompanying drawings.

What is claimed is:

1. A method for programming a nonvolatile memory apparatus, the method comprising:
   providing a bit line selector coupled to a first bit line and a second bit line and a page buffer including a main data transmission switch coupled to the bit line selector, a first latch coupled to the main data transmission switch, a temporary data transmission switch coupled to the bit line selector, and a second latch coupled between the temporary data transmission switch and the first latch; and
   simultaneously turning on the main data transmission switch and the temporary data transmission switch to set up a voltage of the second bit line depending on data levels stored in the first and second latches when the first bit line is precharged to a power supply voltage level.

2. The method according to claim 1, wherein the main data transmission switch is turned on by a signal having a level obtained by summing a threshold voltage of the main data transmission switch and a preset level of voltage having a lower level than the power supply voltage.

3. The method according to claim 1, wherein the second latch comprises a dynamic latch.

4. The method according to claim 3, wherein, when the temporary data transmission switch is turned on, the second latch transitions to a floating state.

5. The method according to claim 1, wherein the second latch is electrically coupled between the temporary data transmission switch and the first latch.

6. The method according to claim 1, wherein the second latch is coupled in series with the first latch and the second latch is coupled in series with the temporary data transmission switch.

7. A method for programming a nonvolatile memory apparatus, the method comprising:
providing a bit line selector coupled to a first bit line and a second bit line and a page buffer including a main data transmission switch coupled to the bit line selector, a first latch coupled to the main data transmission switch, a temporary data transmission switch coupled to the bit line selector, and a second latch coupled between the temporary data transmission switch and the first latch;
classifying a memory cell into one of program-prohibited cell, low-speed program cell, and general program cell through a verification process; and
setting up voltages in a same step of a bit line coupled to the program-prohibited cells, of a bit line coupled to the low-speed program cells, and of a bit line coupled to the general program cells,
wherein, in the step of setting up voltages, the main data transmission switch and the temporary data transmission switch are simultaneously turned on to set up a voltage of the second bit line depending on data levels stored in the first and second latches when the first bit line is precharged to a power supply voltage level.

8. The method according to claim 7, comprising precharging a bit line coupled to unselected memory cells at the same time as the setting up of the voltages, wherein the nonvolatile memory apparatus is configured in such a manner that a pair of bit lines share the page buffer.

9. The program method according to claim 7, wherein the program-prohibited cells comprise a memory cell having a threshold voltage higher than a verification voltage.

10. The program method according to claim 7, wherein the low-speed program cells comprise a memory cell having a threshold voltage higher than a reference voltage and lower than a verification voltage.

11. The program method according to claim 7, wherein the general program cells comprise a memory cell having a threshold voltage lower than a reference voltage.

12. The method according to claim 7, wherein the second latch is electrically coupled between the temporary data transmission switch and the first latch.

13. A system for programming a nonvolatile memory apparatus, comprising:
a bit line selector coupled to first and second bit lines; and
a page buffer including a main data transmission switch coupled to the bit line selector, a first latch coupled to the main data transmission switch, a temporary data transmission switch coupled to the bit line selector, and a second latch coupled between the temporary data transmission switch and the first latch,
wherein the main data transmission switch and the temporary data transmission switch are configured to be simultaneously turned on to set up a voltage of the second bit line depending on data levels stored in the first and second latches when the first bit line is precharged to a power supply voltage level.

14. The system according to claim 13, wherein the main data transmission switch is turned on by a signal having a level obtained by summing a threshold voltage of the main data transmission switch and a preset level of voltage having a lower level than the power supply voltage.

15. The system according to claim 13, wherein the second latch comprises a dynamic latch.

16. The system according to claim 15, wherein, when the temporary data transmission switch is turned on, the second latch transitions to a floating state.

17. The system according to claim 13, wherein the second latch comprises a switch being turned on or off by a temporary data setting signal.

18. The system according to claim 17, wherein the second latch is selectively floated according to the temporary data setting signal.

19. The system according to claim 13, wherein the second latch is electrically coupled between the temporary data transmission switch and the first latch.

20. The system according to claim 13, wherein the second latch is coupled in series with the first latch and the second latch is coupled in series with the temporary data transmission switch.

* * * * *